United States Patent
David

(10) Patent No.: US 6,684,179 B1
(45) Date of Patent: Jan. 27, 2004

(54) SYSTEM FOR MONITORING CONNECTION PATTERN OF DATA PORTS

(75) Inventor: Solomon David, Singapore (SG)

(73) Assignee: iTRACS Corporation, Tempe, AZ (US)

(*) Notice: Subject to any disclaimer, the term of this patent is extended or adjusted under 35 U.S.C. 154(b) by 0 days.

(21) Appl. No.: 09/525,543

(22) Filed: Mar. 14, 2000

(30) Foreign Application Priority Data

Apr. 6, 1999 (SG) ............................................. 9901521

(51) Int. Cl.[7] ............................................. G06F 13/00
(52) U.S. Cl. ........................ 702/183; 702/188; 702/122; 439/488; 439/489
(58) Field of Search ................................ 702/183, 118, 702/120, 122, 124, 126, 182, 186, 188, 189, FOR 103, FOR 104, FOR 134, FOR 135, FOR 170, FOR 171; 709/200, 220–222, 224; 370/248, 241; 361/686, 737; 324/538, 66; 340/687, 686.1; 375/257, 258; 345/736, 969, 966, 734; 439/49, 488, 489, 490, 491, 913, 188, 620, 955, 638, 676, 76.1, 946, 607; 379/25, 27.01, 27.04, 26.01; 710/11

(56) References Cited

U.S. PATENT DOCUMENTS

| | | | |
|---|---|---|---|
| 5,483,467 A | | 1/1996 | Krupka et al. .............. 709/200 |
| 5,492,478 A | * | 2/1996 | White ........................ 439/76.1 |
| 5,695,365 A | * | 12/1997 | Kennedy et al. ............. 439/638 |
| 5,764,043 A | | 6/1998 | Czosnowski et al. ......... 324/66 |
| 5,870,626 A | | 2/1999 | Lebeau ........................ 710/11 |
| 6,217,351 B1 | * | 4/2001 | Fung et al. .................. 439/131 |
| 6,222,908 B1 | | 4/2001 | Bartolutti et al. ........ 379/27.01 |
| 6,227,911 B1 | * | 5/2001 | Boutros et al. ............. 439/620 |
| 6,229,538 B1 | * | 5/2001 | McIntyre et al. ........... 345/734 |
| 6,234,830 B1 | | 5/2001 | Ensz et al. .................. 439/491 |

FOREIGN PATENT DOCUMENTS

| | | |
|---|---|---|
| HU | 201415 A | 10/1990 |
| HU | 216212 B | 5/1999 |

* cited by examiner

Primary Examiner—Hal Wachsman
(74) Attorney, Agent, or Firm—Stroock & Stroock & Lavan LLP

(57) ABSTRACT

The present invention determines and monitors the connection pattern of data ports which are connected by multiconductor cables without requiring special patch cables or patch panels. An adapter jacket having an external contact is placed over a standardized cable such as an RJ45 cable which connects the data ports. An adapter board having a plurality of socket contacts is placed adjacent a plurality of data ports. An output and input module are coupled to the socket contacts. A micro-processor which is coupled to the output and input module scans the socket contacts to determine the connection pattern of the data ports.

7 Claims, 7 Drawing Sheets

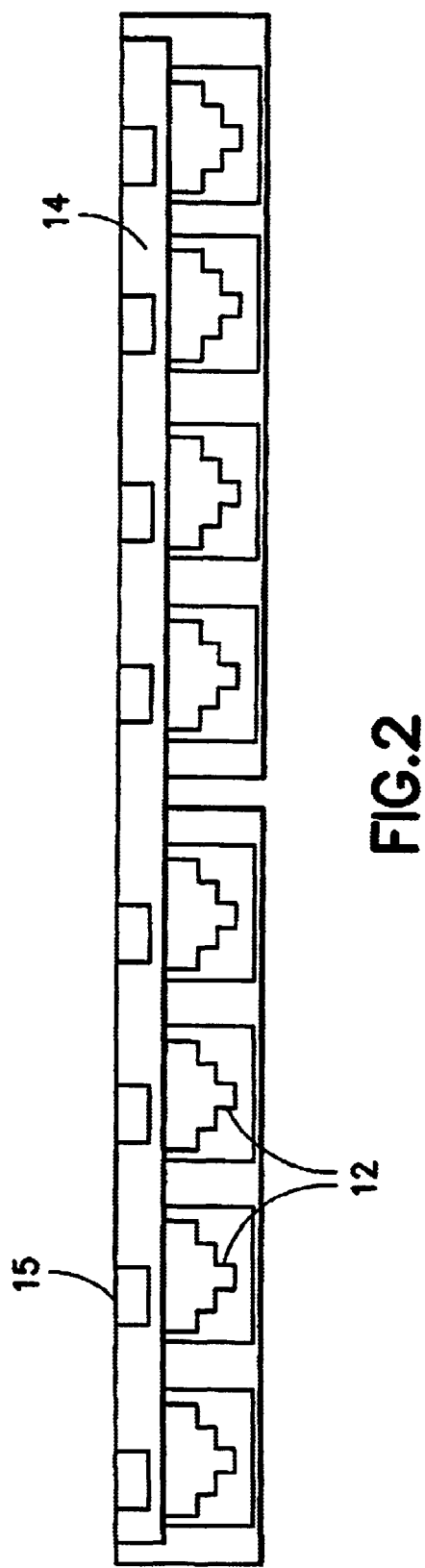

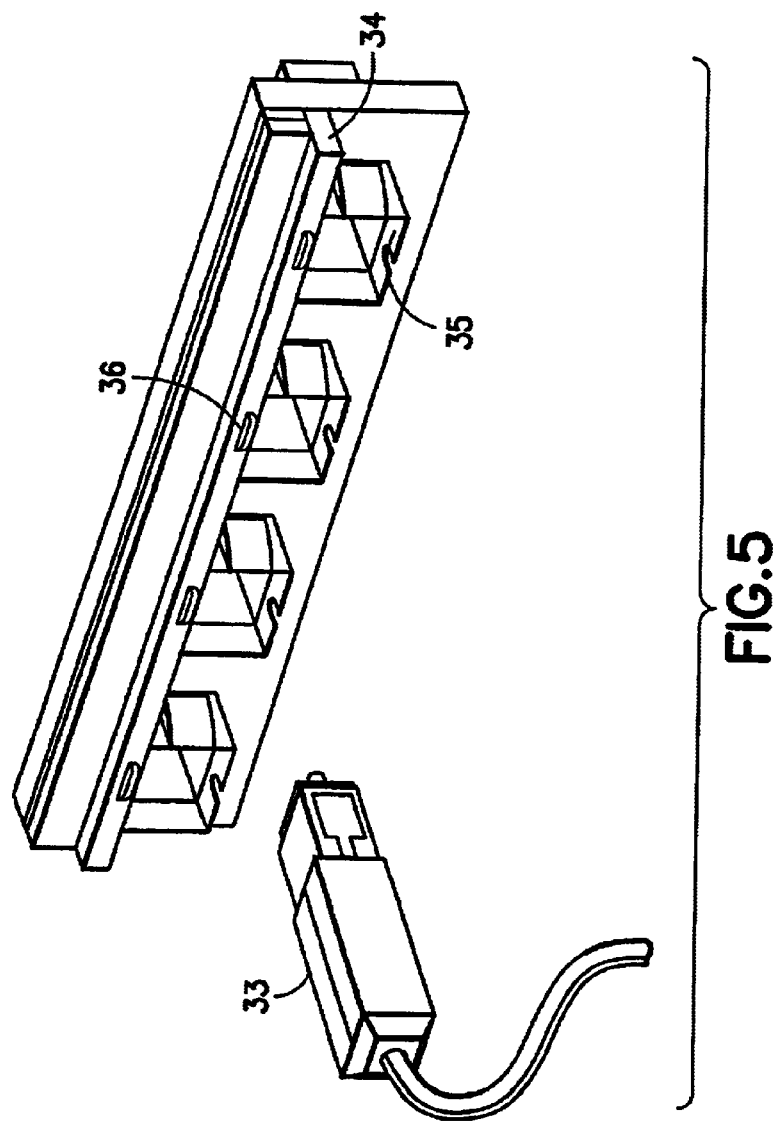
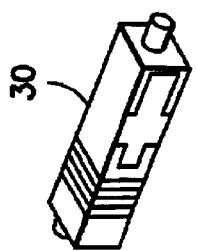
FIG.5A
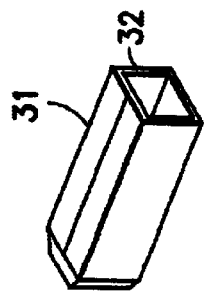
FIG.5B
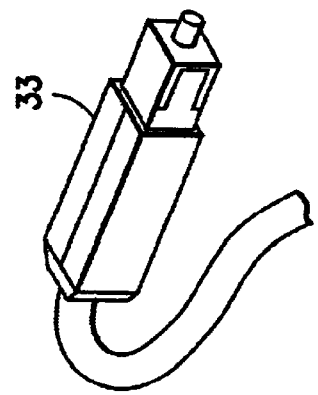
FIG.5C
FIG.5

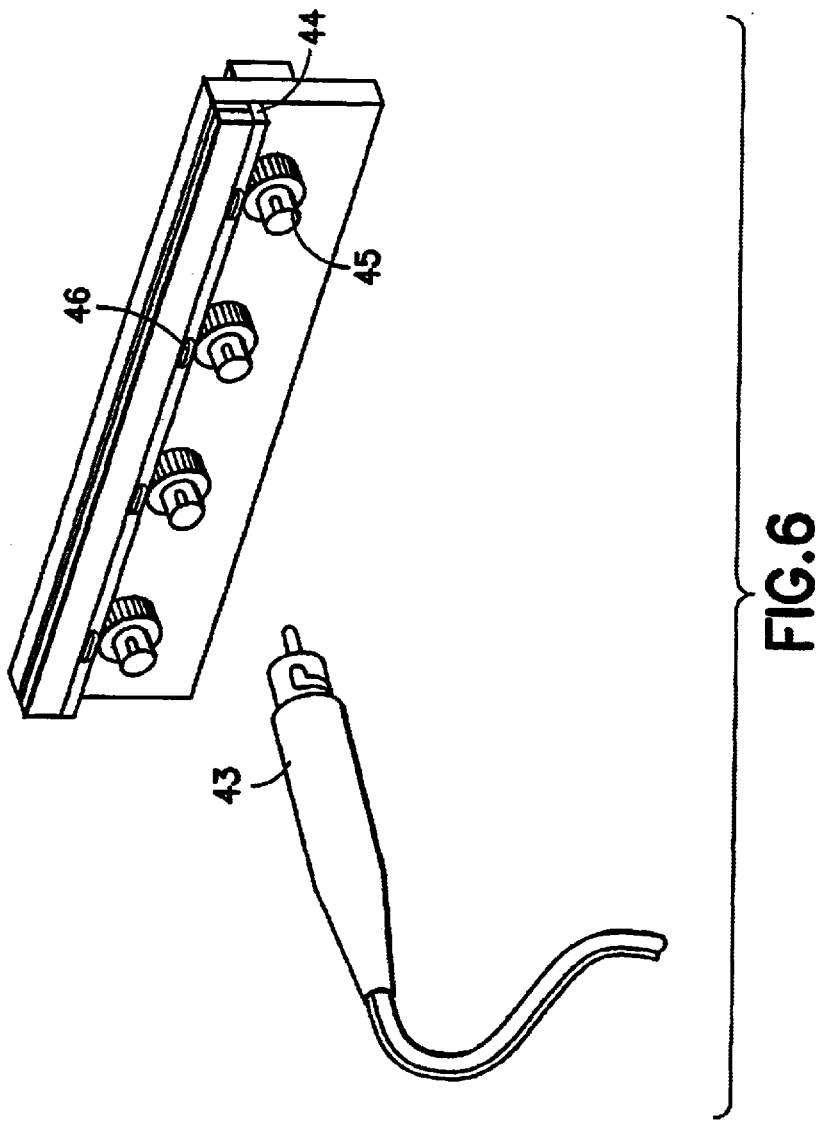
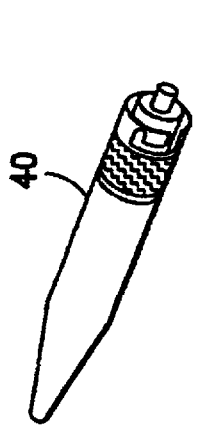
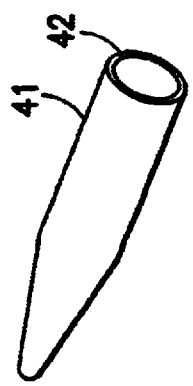
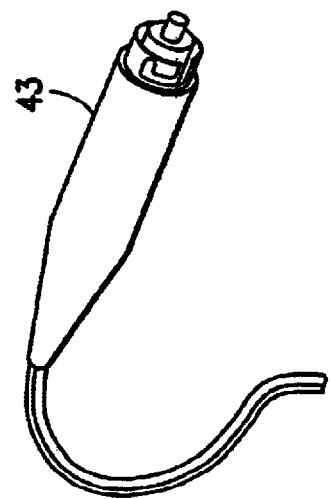

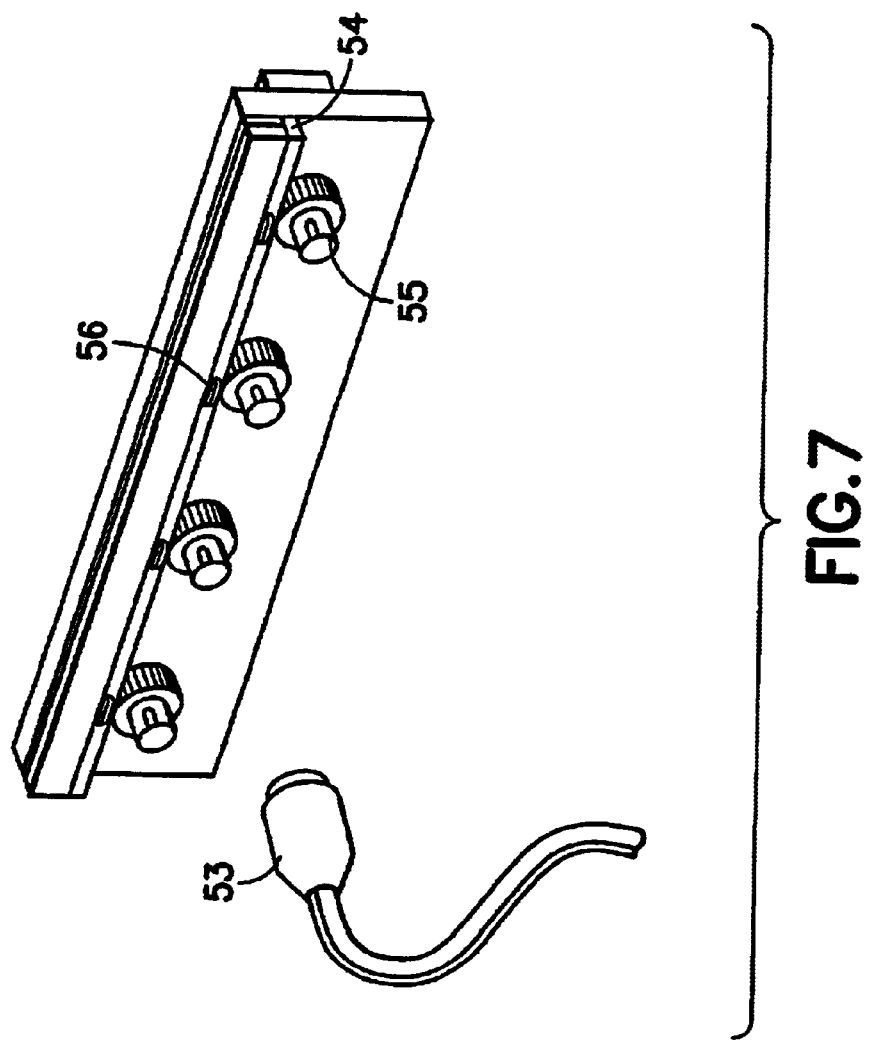
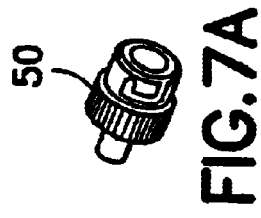
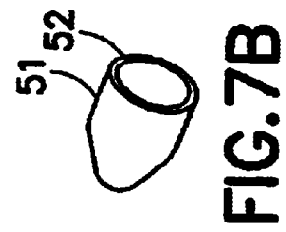
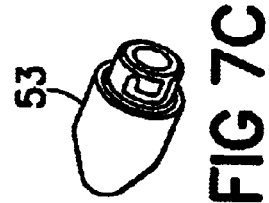
FIG. 7

SYSTEM FOR MONITORING CONNECTION PATTERN OF DATA PORTS

FIELD OF THE INVENTION

The present invention relates to the field of cabled systems and related computer peripheral devices, and more particularly to a system and method for determining interconnection pattern of data ports without requiring special patching cables or patching panels.

BACKGROUND OF THE INVENTION

The problems of tracking the interconnection pattern among the various ports in a local area network are well known to those skilled in the art. At least one system which deals with this problem is described in the U.S. Pat. No. 5,483,467 entitled "Patching Panel Scanner". The patent describes a patching panel scanner which automatically and continuously senses the interconnection arrangement of various ports such as computer ports and user ports. In this type of system, the interconnection between the ports are provided[]by patching cables or alternatively by apparatus of internal connection in patching panels such as the CLPP cordless patching panel available from RIT Technologies Ltd. of Tel Aviv, Israel.

In this type of system, in order to determine the interconnectivity pattern of the various ports, a conductor needs to interconnect the ports and deliver a signal to the scanner indicating the connection status of a particular port. In the modem computer era, it is actually difficult to provide a conductor for this purpose because most modem data cables being used to interconnect various devices have to meet a particular pre-determined standard in the industry. So for instance, a standard cable such as RJ45 eight wires per cable, each having an end which is adapted to mate with an RJ45 port. No free wire allows for scanning for interconnectivity.

Therefore, in the prior art scanner systems, the ports needed to be interconnected via a patch panel which required a special patch cable or an apparatus of internal connections in the patch panels. In any case, the ports could not be connected directly using standard cables. Although the need for and desirability of having a scanner system which can utilize standard cables clearly exist, so far, the industry has been unable to come up with such a system.

OBJECT OF THE INVENTION

It is therefore an objective of the present invention to provide a system for monitoring and determining the inter-connectivity of ports which overcomes the shortcomings of the prior art system described above.

More particularly, it is an object of present invention to provide a system for monitoring and determining the inter-connectivity of ports which does not require special patch panels or patch cables.

More particularly, it is an object of present invention to provide a system for monitoring and determining the inter-connectivity of ports which utilizes standard connection cables.

SUMMARY OF THE INVENTION

The present invention determines and monitors the connection pattern of data ports which are connected by multiconductor cables without requiring special patch cables or patch panels. In order to electronically determine the connectivity between one port to another, it is generally well understood that an electrical conductor needs to connect one port to the other. Although this principle is well known, in the modem era where many of the standardized cables such as RJ11 and RJ45 are used, it is difficult to provide this dedicated conductor for connectivity-scanning purposes because each of the wires within the cable is used for a standardized purpose which may interfere with the connectivity-scanning operation.

In the present connectivity monitoring system, a dedicated conductor which may be attached to an existing cable is provided. The conductor interacts with an adapter board which is attached to a port where the cable is to be connected. To provide an additional contact point for the scanning operation, an adapter jacket is provided which attaches to an RJ45 jack. The adapter jacket is attached to the jack at both ends of the cable. The additional contact point for the scanning operation is provided via an external contact located on the outside of the adapter jacket. An external conductor wire connects the external contact of the jack at each end of the cable such that the contact at each respective end will be electrically coupled to each other.

To provide a contact point for the external contact of the adaptor jacket at the port site, an adapter board is provided above the port sockets with each of the sockets having a socket contact. The socket contact is positioned such that when the RJ45 jack having the adapter jacket is inserted into a socket, the contact of the adapter jacket electrically mates with the socket contact of the adapter board.

In the overall system, the adapter board is coupled to an output module and an input module. The output driver module has a plurality of output drivers, and the receiver module has a plurality of latches (other similar electronic devices can be used instead of latches). Each of the socket contacts is uniquely connected to one output driver and one latch. The output module and the input module are both coupled to a micro-processor which is in turn coupled to a communication interface. The system may be coupled to a local area network or to a computer to report the information regarding the connection pattern.

Both the output module and the input module can be implemented using standard IC devices. The main function of the output module is to provide a plurality of output drivers which address the adaptor contacts and to send a signal to the contacts when instructed to do so by the micro-processor. The main function of the input module is to provide a plurality of latches (or other similar devices) which also address the contacts and to receive the signal sent by the output drivers. The communication interface can also be implemented using standard devices currently available to interface between the micro-processor and local area network and electronic devices.

Now to describe the operation of the present system, the micro-processor has pre-designated one output driver as a first driver and the socket contact which it is connected to as the first contact. The latch in the input module which is connected to the designated first contact is designated as the first latch, The port corresponding to the first socket contact is considered to be the first port. Another driver is pre-designated as a second driver, and its corresponding socket contact is designated as a second contact and its corresponding latch is designated as a second latch. The same designation scheme is applied to third, fourth, fifth, and so on, driver/contact/latch groupings such that all groups are uniquely designated.

Initially, all of the socket contacts are at low state with no signal being sent to them by the output module. To monitor the connectivity of the various ports, the micro-controller causes the designated first output driver to send out a pulse signal to the socket contact which the micro-controller has designated as the first contact. This places the first socket contact at a high state, and consequently, also places the first latch in the input module at the high state. After sending out the signal, the micro-controller scans the input module for a latch having a high state. If only the first latch indicates a high, then the micro-controller concludes that no valid connection has been made between the first port and another port. If, however, a port other than the first port, port one, indicates a high state, for instance port seven, then the micro-controller concludes that the port is validly connected to port seven. Once the connectivity state of port one is determined, the result is stored in memory and the same process is repeated for port two and so on until all of the ports' connection status has been determined.

BRIEF DESCRIPTION OF THE DRAWINGS

FIG. 2 is a front view of a plurality of RJ45 sockets fitted with an adapter board of the present invention.

FIGS. 6, 6A, 6B, 6C illustrate various other standard cables which can be adapted for use with the present system.

FIGS. 7, 7A, 7B, 7C illustrate various other standard cables which can be adapted for use with the present system.

DETAILED DESCRIPTION OF THE INVENTION

In order to electronically determine the connectivity between one port to another, it is generally well understood that an electrical conductor needs to connect one port to the other. Although this principle is well known, in the modem era where many of the standardized cables such as RJ11 and RJ45 are used, it is difficult to provide this dedicated conductor for connectivity-scanning purposes because each of the wires within the cable is used for a standardized purpose which may interfere with the connectivity-scanning operation. Although it may be possible to share an existing wire in the cable for the scanning operation, this would require additional circuitry for differentiating between the signals used for the scanning purposes and the signals used for other purposes such as data transfer. Moreover, in many cases, it may be impossible to effectively share an existing wire or conductor.

In the present connectivity monitoring system, a dedicated conductor which may be attached to an existing cable is provided, The conductor interacts with an adapter board which is attached to a port where the cable is to be connected. Although in describing the preferred embodiment of the present invention, a specific cable/port combination utilizing a common standard such as RJ45 will be shown, it should be appreciated that this is done for illustration purposes only, and is not meant to limit the present invention to this illustrative example.

Figure 1A:
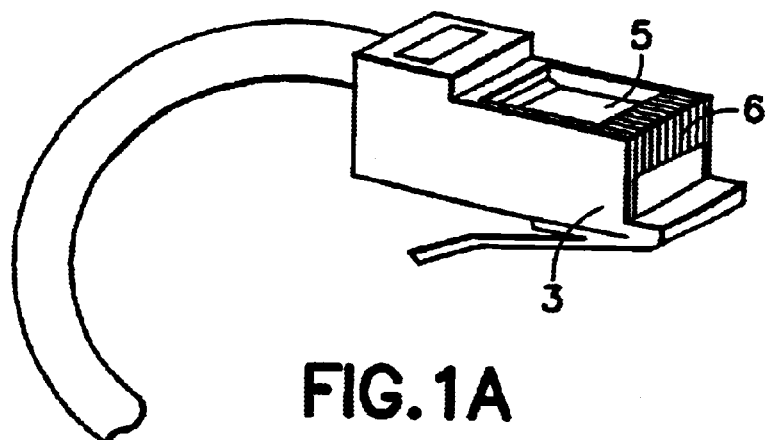
FIG. 1A is a perspective illustration of a current RJ45 cable which an be adapted to work with the present system.
Figure 1B:
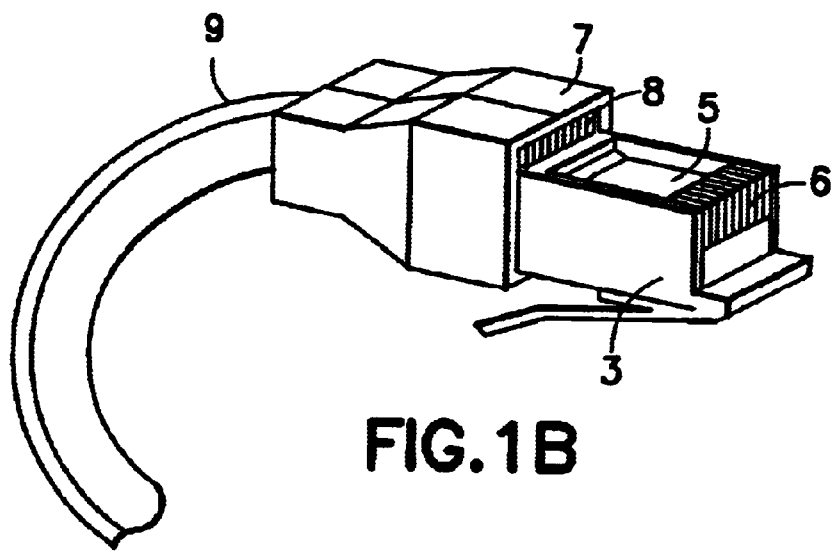
FIG. 1B is a perspective illustration of the RJ45 cable of FIG. 1A which has been fitted with an adapter jacket of the present invention.
Figure 1C:
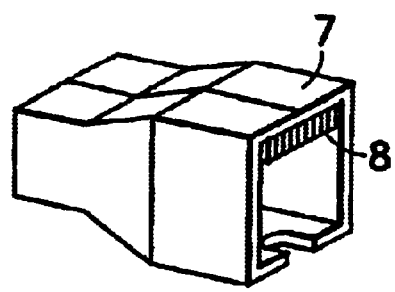
FIG. 1C is an isolated perspective illustration of an adapter jacket of the present invention which is adapted for an RJ45 cable jack.

Now in referring to FIG. 1A, a standard RJ45 cable 3 having a jack 5 is shown. Although only one end of the cable is shown here in FIG. 1A for illustration purposes, it should be understood that a similar jack is attached to the other end of the cable. The RJ45 jack 5 has eight standard contact points 6. To provide an additional contact point for the scanning operation, an adapter jacket 7, FIG. 1C, is provided which attaches to the RJ45 jack as shown in FIG. 1B. The adapter jacket is attached to the jack 5 at both ends of the cable 3 (though only one is shown in the figure). The additional contact point for the scanning operation is provided via an external contact 8 located on the outside of the adapter jacket 7. An external conductor wire 9 connects the external contact 8 of the jack 5 at each end of the cable 3 such that the contact 8 at each respective end will be electrically coupled to each other.

Now referring to FIG. 2, a plurality of RJ45 sockets is shown which are standard sockets which mate with a standard RJ45 jack. The sockets may be ports for a network equipment such as a 10 Base-T hub, PABX, and key-phone system, or may be part of a patch panel, though a special patch panel is not required for a successful operation of the present system. To provide a contact point for the external contact 8 of the adaptor jacket 7, an adapter board 14 is provided above the sockets 12 with each of the sockets 12 having a socket contact 15. The socket contact 15 is positioned such that when the RJ45 jack 5 having the adapter jacket 7, as shown in FIG. 1B, is inserted into a socket 12 of FIG. 2, the contact 8 of the adapter jacket 7 electrically mates with the socket contact 15 of the adapter board 14. Although here the adapter board 14 is shown to carry a plurality of socket contacts 15, it is entirely possible, and sometimes desirable, to have an adapter board 14 which carries only one socket contact which is used on a single isolated socket.

Figure 3:
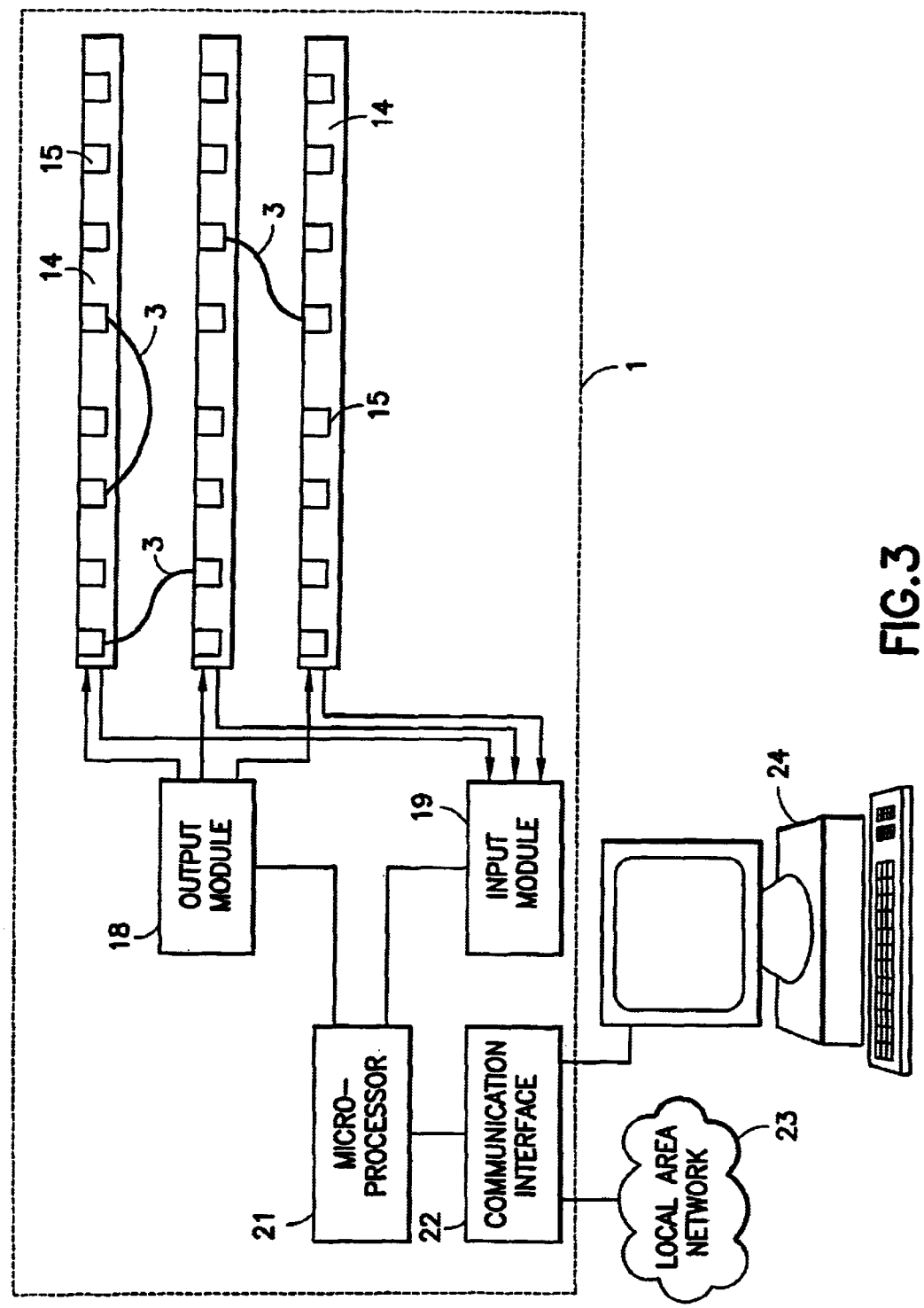
FIG. 3 is a simplified schematic illustration of the present connectivity monitoring system.
Figure 4:
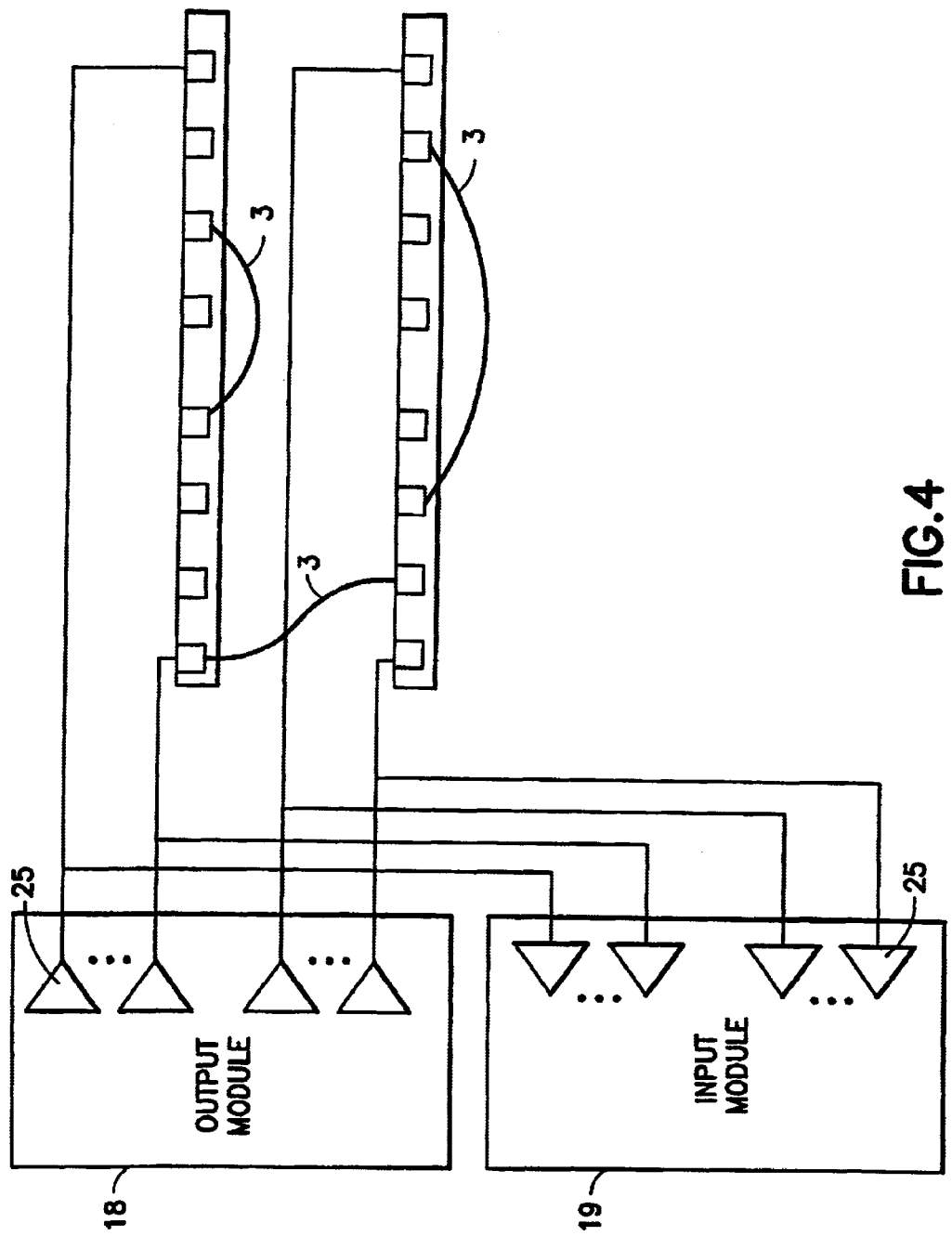
FIG. 4 is a simplified schematic illustration which shows the receiver latches. relationship between the output drivers, the socket contacts, and the FIGS. 5, 5A, 5B, 5C illustrate various other standard cables which can be adapted for use with the present system.

Referring now to FIG. 3, a simplified schematic illustration of the present system 1 is shown. The adaptor board 14 of FIG. 2 is coupled to an output module 18 and input module 19. As shown in more detail in FIG. 4, the output driver module 18 has a plurality of output drivers 20, and the receiver module 19 has a plurality of latches 25 (other similar electronic devices can be used instead of latches). Each of the socket contacts 15 is uniquely connected to one output driver 20 and one latch 25. The output module 18 and the input module 19 are both coupled to a micro-processor 21 which is in turn coupled to a communication interface 22. The system 1 may be coupled to a local area network 23 or to a computer 24 to report the information regarding connectivity.

Now to describe the system 1 in greater detail, the adapter board 14 shown in FIG. 3 is placed over port sockets (not shown in FIG. 3 but shown in FIG. 2). The micro-processor 21 has pre-designated one output driver as a first driver and the socket contact which it is connected to as the first contact. The latch in the input module 19 which is connected to the designated first contact is designated as the first latch. The port corresponding to the first socket contact is considered to be the first port.

Both the output module and input module can be implemented using standard IC devices. The main function of the output module 18 is to provide a plurality of output drivers 20 which address adaptor contacts 15 and to send a signal to the contacts 15 when instructed to do so by the microprocessor 21. The main function of the input module 19 is to provide a plurality of latches 25 (or other similar devices) which also address the contacts 15 and to receive the signal sent by the output drivers. The communication interface 22 can also be implemented using standard devices currently available to interface between the micro-processor 21 and local area network 23 and electronic devices. Another driver is pre-designated as a second driver, and its corresponding socket contact is designated as a second contact and its corresponding latch is designated as a second latch. The same designation scheme is applied to third, fourth, fifth, and so on, driver/contact/latch groupings such that all groups are uniquely designated. Of course, the designations are somewhat arbitrary and the particular designation number or scheme is not important so long as the individual groupings are uniquely traceable by the micro-controller 21.

Initially, all of the socket contacts 15 are at low state with no signal being sent to them by the output module 18. To monitor the connectivity of the various ports, the micro-processor 21 causes the designated first output driver to send out a pulse signal to the socket contact 15 which the micro-processor 21 has designated as the first contact. This places the first socket contact at a high state, and consequently, also places the first latch in the input module 19 at the high state. After sending out the signal, the micro-processor 21 scans the input module 19 for a latch having a high state. If only the first latch indicates a high, then the micro-processor 21 concludes that no valid connection has been made between the first port and another port. If, however, a port other than the first port, port one, indicates a high state, for instance port seven, then the micro-processor 21 concludes that the port 1 is validly connected to port seven. Once the connectivity state of port one is determined, the result is stored in memory and the same process is repeated for port two and so on until all of the ports' connection status has been determined.

While other scanning scheme can be employed with the present system, the scheme described above is the one employed in the preferred embodiment. The advantage of the scheme described above is that it allows any port to be connected to any other port. This is unlike patch panel scanning systems where one panel may need to be designated as the input panel, and the other panel is designated as the output panel, and a cable needs to connect a port from the output panel to a port from the input panel. The cable cannot connect, for instance, a port from the input panel to another port from the same input panel. This feature is particularly useful for the present invention because no special patch panels are required, and so the ports may be randomly spread out in no particular order.

Although the present invention has been illustrated using the RJ45 standard, one skilled in the art should appreciate that the present invention can be implemented using other existing standards. Some such examples are shown in FIGS. 5, 6, and 7, where the currently available SC connectors, ST connectors, and BNC connectors, respectively, are fitted with an adapter jacket and their respective ports are provided with an adapter board.

In FIGS. 5, 5A, 5B, and 5C, a standard SC connector 30 is fitted with an adaptor jacket 31 having a contact 32 to yield an adapted SC connector 33. Also, the SC connector sockets 35 have been fitted with adaptor boards 34 with adaptor contact points 36.

In FIGS. 6, 6A, 6B, and 6C, a standard ST connector 40 is fitted with an adaptor jacket 41 having a contact 42 to yield an adapted ST connector 44. Also, the ST connector sockets 45 have been fitted with adaptor boards 44 with adaptor contact points 46.

In FIGS. 7, 7A, 7B, and 7C, a standard BNC connector 50 is fitted with an adaptor jacket 51 having a contact 52 to yield an adapted BNC connector 55. Also, the BNC connector sockets 55 have been fitted with adaptor boards 54 with adaptor contact points 56.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

I claim:

1. Apparatus for interconnecting a plurality of data transmission cables in a system for electronically detecting the interconnection of said data transmission cables, said apparatus comprising:

a patch panel comprising a housing having a front surface;

a plurality of sockets disposed in said front surface, said plurality of sockets comprising a plurality of side walls extending rearwardly from said front surface to form a plurality of cavities rearward of said front surface, said plurality of sockets each adapted to receive a data transmission cable;

a plurality of external contacts, each of said plurality of external contacts comprising an electrically isolated conductive member disposed on said front surface adjacent a corresponding one of said plurality of sockets; and a plurality of leads, each of said plurality of leads being individually connected to one of said electrically isolated conductive members, said plurality of leads further interconnecting said electrically isolated conductive members to a micro-processor for sending and receiving signals through said leads indicative of the interconnection of said data transmission cables.

2. The apparatus of claim 1, wherein:

each of said plurality of external contacts comprises a conductive pad.

3. The apparatus of claim 1, wherein:

said plurality of external contacts are disposed on an adapter board mountable on said front surface of said housing.

4. The apparatus of claim 1, wherein:

said data transmission cable comprises a first connector and second connector and a multi-conductor cable therebetween, each of said first and second connectors comprising an outward-facing distal end insertable into one of said plurality of sockets, said data transmission cable further comprising an external contact disposed proximate each of said first and second connectors; said external contacts adapted to contact one of said electrically isolated conductive members when one of said first and second connectors is inserted into one of said plurality of sockets.

5. The apparatus of claim 4, further comprising a conductor extending between said external contacts, said conductor separate from said data transmission cable.

6. The apparatus of claim 1, wherein said plurality of sockets are constructed to accept an RJ11 or RJ45 Jack.

7. The apparatus of claim 1, wherein said data transmission cables comprise RJ11 or RJ45 Jacks.

* * * * *